United States Patent [19]

Nyffeler

[11] Patent Number: 4,516,093

[45] Date of Patent: May 7, 1985

[54] SURFACE ACOUSTIC WAVE FILTER

[75] Inventor: Felix Nyffeler, Affoltern, Switzerland

[73] Assignee: Siemens-Albis AG, Zurich, Switzerland

[21] Appl. No.: 518,562

[22] Filed: Jul. 29, 1983

[30] Foreign Application Priority Data

Sep. 7, 1982 [CH] Switzerland ............... 5310/82

[51] Int. Cl.³ .................... H03H 9/145; H03H 9/64
[52] U.S. Cl. ....................... 333/193; 310/313 B; 333/154; 333/194; 333/196
[58] Field of Search ...................... 333/150–155, 333/193–196; 310/313 R, 313 A, 313 B, 313 C, 313 D; 364/821, 861

[56] References Cited

U.S. PATENT DOCUMENTS

| 3,770,949 | 11/1973 | Whitehouse et al. | 364/821 |
| 3,800,248 | 3/1974 | Speiser et al. | 310/313 C |
| 3,866,154 | 2/1975 | Moore | 333/154 |
| 4,200,849 | 4/1980 | Malocha | 310/313 X |
| 4,429,246 | 1/1984 | Miyajima | 310/313 B |

OTHER PUBLICATIONS

Kallard (editor)–"Acoustic Surfacewave and Acousto-Optic Devices", Optosonic Press, New York, N.Y., copyright 1971, title page and pp. 81–87.
"Mikrowellenakustic" (Microwave Acoustics), Technische Rundschau, No. 16, Apr. 18, 1978, p. 17.
Hewlett–Packard Journal, Dec. 1981, p. 5, (FIG. 3).
"I.E.E.E. Group on Sonics and Ultrasonics", Ultrasonic Symposium, Sep. 22–24, 1975, pp. 317–321.
6th European Microwave Conference 1976, Rome, Sep. 14–17, 1976, AEI, pp. 267–271.

Primary Examiner—Marvin L. Nussbaum
Attorney, Agent, or Firm—Karl F. Milde, Jr.

[57] ABSTRACT

A surface acoustic wave (SAW) filter features a ground lead in a transducer that has an aperiodic meander structure. This arrangement permits the self-capacitance and inherent resistance of the transducer to be utilized in forming the RC networks of a phase shifter associated with the transponder.

7 Claims, 6 Drawing Figures

STATE OF THE ART

SURFACE ACOUSTIC WAVE FILTER

BACKGROUND OF THE INVENTION

This invention concerns a surface acoustic wave (SAW) filter comprising a piezoelectric substrate having send and receive transducers applied to its surface. The transducers are formed by a multiplicity of electrodes arranged in an interlocking-finger design that are connected in two half-groups either to one terminal for a signal with a first phase relationship, or to another terminal for a signal with a second phase relationship, while a meandering ground line is led between the two half-groups.

SAW (Surface Acoustic Wave) filters are generally known to be electrical filters operating with elastic compressional (acoustic) waves that propogate on the surfaces of piezoelectric crystals. However, as is described, for example, in the article "Mikrowellenakustik" (Microwave Acoustics) in *Technische Rundschau*, No. 16, Apr. 18, 1978, pp. 17, such SAW filters can operate with frequencies that are well above the strictly acoustical range. The core element of a typical SAW filter consists of a piezoelectric substrate having both a send and a receive transducer applied to its surface. These two transducers are comprised of electrodes arranged in an interlocking-finger design, in which the distance between two successive electrodes as well as the width of the electrodes are constant.

Such SAW filters operate in a manner that, if an electrical input signal is applied to the send transducer from a signal source, a periodic electrical field is generated at the send transducer and, due to the effect of the piezoelectric coupling, the input signal is converted into a surface acoustic wave that propagates along the piezoelectric substrate. At the receive transducer, the surface acoustic wave is converted into an electrical output signal which is applied to an external load. Send and receive transducers thus form a converter with a characteristic transfer function. In practice, SAW filters and constructed to provide very distinctive filter characteristics.

Presently, with simple transducer types the surface waves are propagated in the two directions, resulting in losses. Furthermore, it is not possible to match simple transducers to the source impedance. Therefore, directional transducers are used that operate as three-phase transducers or as group transducers. Three-phase transducers have a multilayer structure; therefore, their production is very complex.

The group transducers, on the other hand, have a planar construction and can be manufactured considerably easier.

Known group transducers have several groups of electrodes each consisting of 2n electrodes of which n successive electrodes form half a group of one phase relationship and the remaining n successive electrodes form half a group of another phase relationship while a meandering ground line is led between each two group halves. Furthermore, additional grounded electrode fingers are threaded between the n electrodes. As a result, a source impedance match for a filter with several groups can only be achieved by means of phase shifters. Such filters, however, prove to be of disadvantage with regard to the undesirable side frequency maxima. To avoid this disadvantage, transducers are known in which the finger electrodes have varying lengths. See, for example, the *Hewlett-Packard Journal,* Dec. 1981, page 5, (FIG. 3); "IEEE Group on Sonics and Ultrasonics" *Ultrasonics Symposium,* Sept. 22–24, 1975, pp. 317–321; and *6th European Microwave Conference* 1976, Rome, Sept. 14 to 17, 1976, AEI, pp. 267–271.

Side frequency maxima can be suppressed by these measures; however, relatively complicated phase shifters must be provided.

SUMMARY OF THE INVENTION

An object of the present invention is to provide a surface acoustic wave (SAW) filter of the type described above, having at least one directional transducer which exhibits a distinct resonant frequency.

A further object of the present invention is to provide a SAW filter having a directional transducer which may be easily matched to the source impedance.

These objects, as well as other objects which will become apparent from the discussion that follows, are achieved, according to the present invention, by providing a SAW filter with a send transducer, a receive transducer, or both a send and a receive transducer which is constructed as follows:

Each transducer has a plurality of electrodes arranged in interlocking finger design and connected into two half-groups. The electrodes of the first half-group are connected to a first terminal for transmission of a signal with a first phase relationship, and the electrodes of the second half-group are connected to a second terminal for transmission of a signal with a second phase relationship. The transducer also has a meandering ground line that passes back and forth between the half-groups and forms, on the surface of the piezoelectric substrate, an aperiodic meander structure.

For further features, configurations and characteristics of the SAW filter according to the invention, reference should now be made to the following detailed description of the preferred embodiments of the invention and to the accompanying drawings.

DESCRIPTION OF THE PREFERRED EMBODIMENTS

Figure 1:
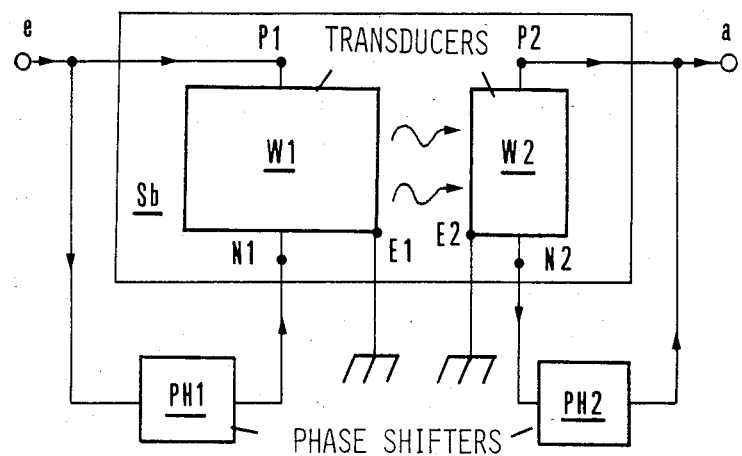
FIG. 1 is a block diagram showing the basic design of a SAW filter with a send and a receive transducer and two phase shifters.

A SAW filter shown in FIG. 1 has a piezoelectric substrate Sb with send transducer W1 and a receive transducer W2 arranged on the substrate surface. In this case, an input signal e is applied to a terminal P1 and, via a 90-degree phase shifter PH1, also to the other terminal N1 of the send transducer W1. Correspondingly, one terminal N2 of the receive transducer W2 is connected via a second 90-degree phase shifter PH2 to its other terminal P2. The output signal a is taken from terminal P2. Both transducers W1 and W2 are grounded via additional terminals E1 and E2, respectively. The basic method of operating such a SAW filter is described in the *Hewlett-Packard Journal* article mentioned previously and, therefore, requires no explanation here.

Figure 2:
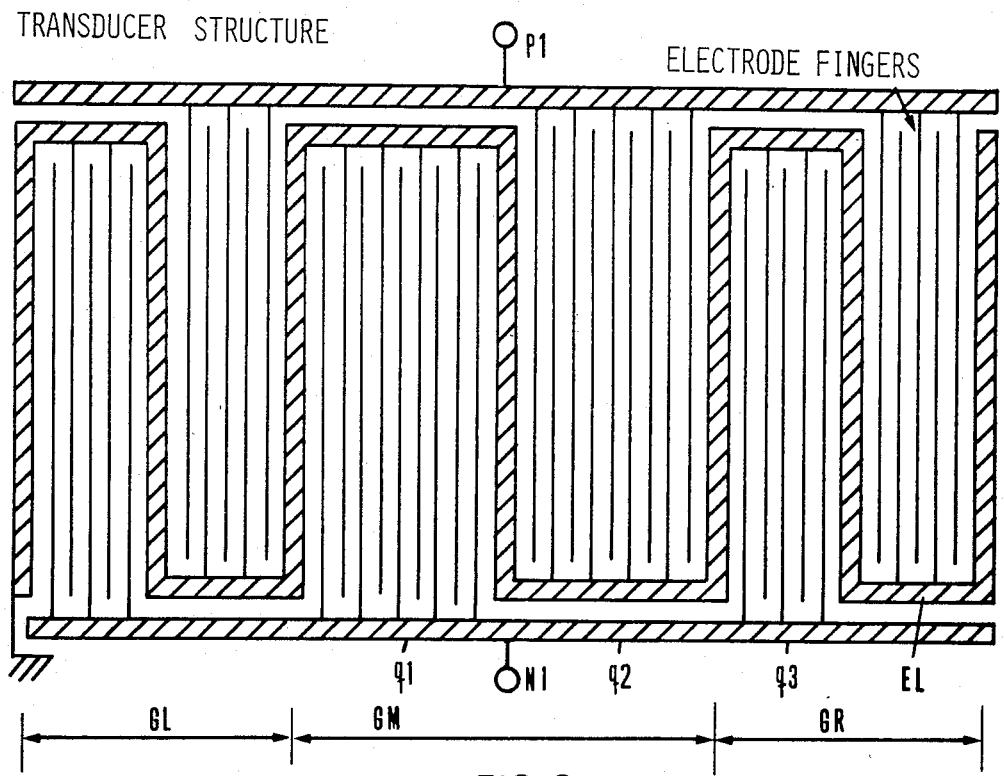
FIG. 2 is a schematic representation of a directional transducer according to the first embodiment of the present invention.

FIG. 2 shows the structure of a directional transducer according to the invention which can be used as either the send transducer W1 or receive transducer W2 in a SAW filter of the type shown in FIG. 1. This directional transducer includes three groups of electrodes (GL, GM, GR) of which the center group GM has five electrode fingers each that are connected to terminals P1 or N1, respectively. In contrast, the side groups GL and GR have only three electrode fingers each that are connected to the terminals P1 or N1. As may be seen, each one of the groups is divided into two half-groups which are separated from one another by a meandering ground line EL. The ground line is connected to other additional electrode fingers each of which are arranged between two successive electrode fingers of the groups. As FIG. 2 also indicates, the geometric distance between any two adjacent finger electrodes is always the same for all three groups GL, GM and GR. Since the middle group has more electrodes, the width of this group GM is greater than the width of either side group GR or GL. Consequently, if the half-group centers q1, q2 and q3 of three consecutive half-groups are positioned at two unequal distances q1q2 and q2q3 (as shown in FIG. 2), the meandering ground line is aperiodic.

It will be understood that the transducer can have more than three groups and/or a different number of finger electrodes per group: for example, six central groups GM with three finger electrodes each and seven side groups GL or GR each with two finger electrodes, according to formula 7GL2/6GM3/7GR2. A group can also consist of only one finger electrode each for each phase relationship. The transducer structure may also be asymmetrical.

The receive transducer W2 can be constructed to be identical to the transducer W1 shown in FIG. 2. However, the structure of the receive transducer W2 preferably should be shorter than that of the send transducer associated with it; i.e., with less groups and/or with less finger electrodes per group. For example, for a send transducer W1 having the formula W1=7GL2/6GM3/7GR2, the receive transducer W2 may have the formula 4GL2/0GM/4GR2. It is also possible to choose one of the transducers W1 or W2 in accordance with the state of the art; that is, a transducer with a constant number of electrodes per group in which the electrode lengths may be the same or may vary in the manner shown in FIG. 3.

A SAW filter with at least one electrode structure according to FIG. 2 exhibits a relatively favorable frequency characteristic and also permits good source impedance matching if suitably dimensioned.

Figure 4:
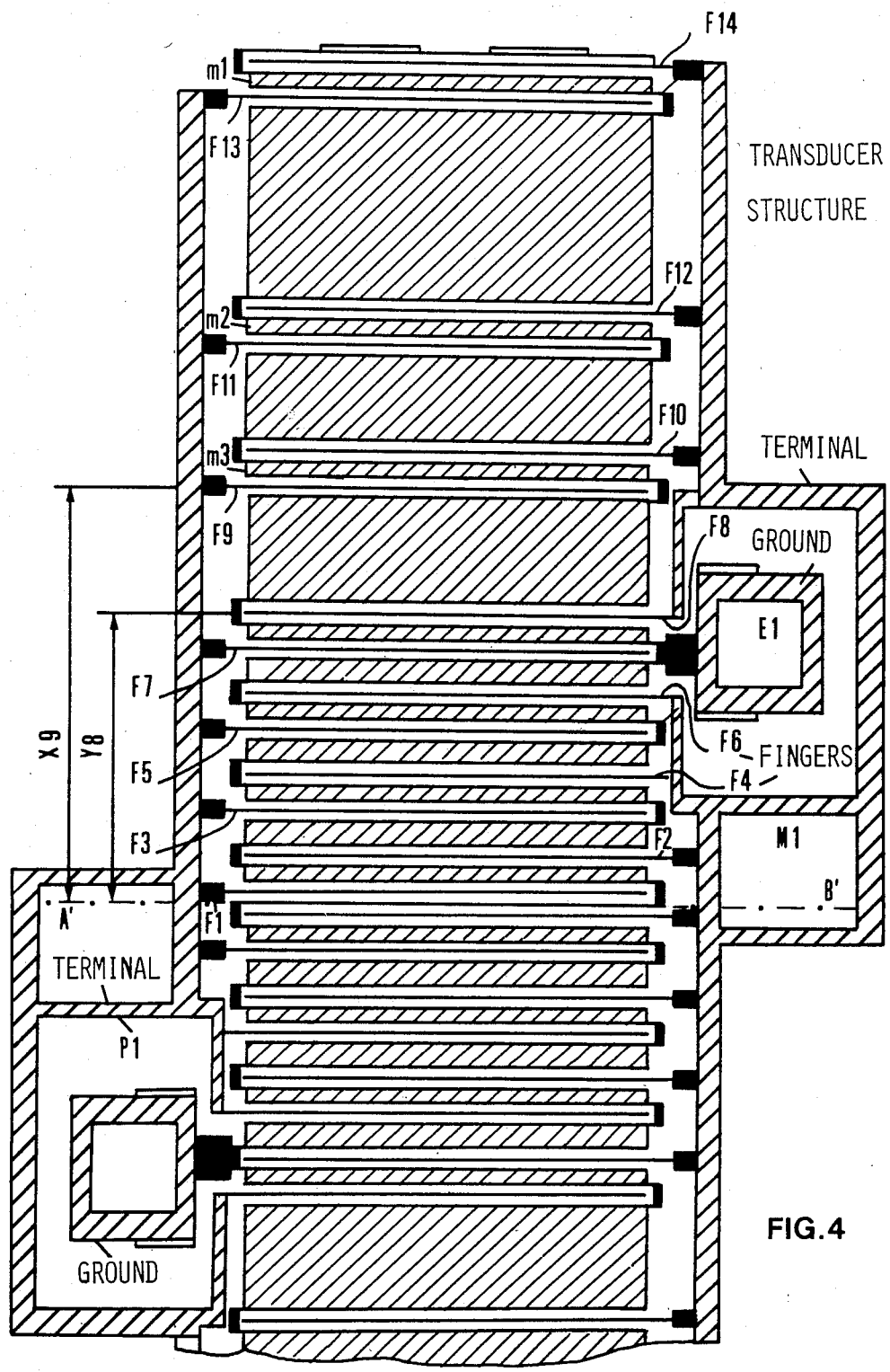
FIG. 4 is a schematic representation of a directional transducer according to a second embodiment of the present invention.

For simplification, the drawing in FIG. 4 shows only one half of a transducer structure for a transducer W1 or W2. Since the other half of the structure is point symmetrical with respect to the structure shown, the entire transducer is represented by the illustration. In this figure, a reference axis A'B' is drawn in to indicate the axis of symmetry. The central symmetry point is located along this axis. In the half of the transducer structure which is shown, seven finger electrodes F1, F3, . . . are connected to the terminal P1 and seven finger electrodes F2, F4 . . ., are connected to the terminal M1. All of the finger electrodes extend parallel to the axis A'B'.

The distance of the finger electrodes F1, F3, . . . and F2, F4, . . . to axis A'B' is $X_i$ where $i=1, 3, \ldots$ or $Y_i$ where $i=2, 4 \ldots$.

In FIG. 4, distances $X_i$ or $Y_i$ are proportional to values $Z_i$ indicated in the following table:

TABLE I

| | | | | | |
|---|---|---|---|---|---|
| Z1 = 2   | D1 = 15  | Z2 = 9   | D2 = 15  | U1 = 7  | U2 = 8  |
| Z3 = 17  | D3 = 15  | Z4 = 24  | D4 = 15  | U3 = 7  | U4 = 8  |
| Z5 = 32  | D5 = 15  | Z6 = 39  | D6 = 15  | U5 = 7  | U6 = 8  |
| Z7 = 47  | D7 = 30  | Z8 = 54  | D8 = 30  | U7 = 7  | U8 = 23 |
| Z9 = 77  | D9 = 26  | Z10 = 84 | D10 = 26 | U9 = 7  | U10 = 19 |
| Z11 = 103| D11 = 45 | Z12 = 110| D12 = 45 | U11 = 7 | U12 = 38 |
| Z13 = 148|          | Z14 = 155|          | U13 = 7 |          | where $Z_i = k \times X_i$ for $i=1, 3, \ldots$ and $Z_i = k \times Y_i$ for $i=2, 4 \ldots$.

In Table I, the values D1, D3, . . . are the differences between each of two consecutive values of the series Z1, Z3, . . . , and the values D2, D4 are the differences between each of two consecutive values of the series Z2, Z4, . . . . Each of the values U1, U3, . . . correspond to the difference between two values $Z_i$ and $Z_j$ of the same series as, for example, $U5 = Z6 - Z5 = 7$. Each of the values U2, U4, . . . correspond to the difference $Ui = Z(+1) - Z_i$; e.g., $U4 = Z5 - Z4 = 8$. Table I shows that series D1, D3, . . . and D2, D4, . . . deviate very little from the ideal series 15, 15, 15, 30, 30, 45 where B=15 is the base of the series.

The values of series U1, U3, . . . are approximately constant and equal to 7. Value U1 can be selected so that the following condition applies:

$$2 \cdot U1 < B$$

For U1=7 and B=15 this condition is met. In contrast to this, values U2, U4, U6, U8, U10, U12 are not constant which is not the case for state-of-the-art filters. If m1, m2, m3 are the group centers of the last three electrode groups (F13, F14), (F11, F12), and (F9, F10), the distance between points m1 and m2 = 7+U12 = 7+38 = 45 and the distance m2 m3 = 7+U10 = 7+19 = 26; this results in m1 m2 < m2 m3. In general, series D1, D3, . . . and D2, D4, . . . can assume the following ideal form:

$$B, B, B, \ldots B, 2B, 2B, \ldots 2B, 3B, 3B \ldots$$

However, it is advantageous to provide a size deviation in the range of ±1% to ±34% for at least one value to build in a certain asymmetry. Consequently, values D9 = D16 = 26 instead of 30 were chosen as was deemed appropriate.

Figure 5:
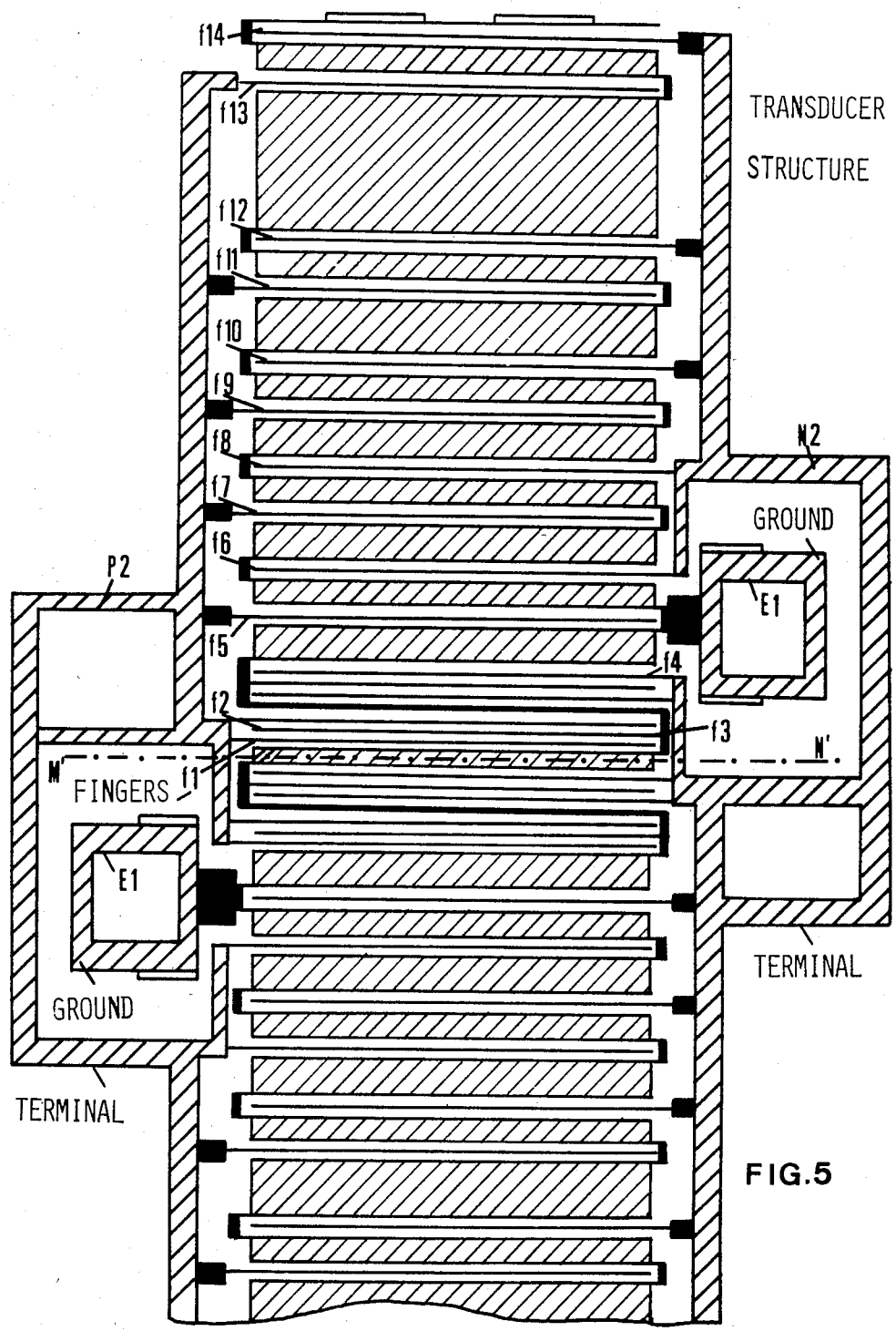
FIG. 5 is a schematic representation of a directional transducer according to a third embodiment of the present invention.

For the purpose of simplification, FIG. 5 also shows only one complete half of a point-symmetrical transducer structure with a reference axis of symmetry M'N'.

This embodiment of the invention may also serve as either transducer W1 or W2, or both.

The structure half has seven finger electrodes in each circuit f1, f2, f5, f7, f9, f11, f13 or f3, f4, f6, f8, f10, f12, f14, which are arranged in parallel to axis M'N' and connected to either terminal P2 or N2. The distance of finger electrodes f1, f2, f5, ... or f3, f4, f6, ... to the axis M'N' should be xi where i=1, 2, 5, ... or yi where i=3, 4, 6, .... In FIG. 5, distances xi or yi are proportional to values zi as indicated in the following table:

TABLE II

| z1 = 2,5 | d1 = 4 | z3 = 11,5 | d3 = 4 | u1 = 9 | u3 = 5 |
|---|---|---|---|---|---|
| z2 = 6,5 | d2 = 19 | z4 = 15,5 | d4 = 19 | u2 = 9 | u4 = 10 |
| z5 = 25,5 | d5 = 19 | z6 = 34,5 | d6 = 19 | u5 = 9 | u6 = 10 |
| z7 = 44,5 | d7 = 19 | z8 = 53,5 | d8 = 19 | u7 = 9 | u8 = 10 |
| z9 = 63,5 | d9 = 22 | z10 = 72,5 | d10 = 22 | u9 = 9 | u10 = 13 |
| z11 = 85,5 | d11 = 38 | z12 = 94,5 | d12 = 38 | u11 = 9 | u12 = 29 |
| z13 = 123,5 | | z14 = 132,5 | | u13 = 9 | | where $z_i = k \times x_i$ for i=1, 2, 5, 7, 9, ... and $z_i = k \times y_i$ for i=3, 4, 6, 8, .... Values di are derived from the difference between two consecutive values each of series z1, z2, z5, z7, ... or z3, z4, z6, .... Values u1, u2, u5, u7, ... each correspond to the difference between two values $z_i$ and $z_j$ of the same series as, for example, $u7 = z8 - z7 = 9$ and values u3, u4, u6, u8, u10, u12 correspond to the differences between two values $z_i$ and $z_j$ of two consecutive series such as $u6 = z7 - z6 = 10$.

Table II shows that the series d2, d5, d7, db 9, d11 and d4, d6, d8, d10, d12 deviate relatively little from the ideal series.

19; 19; 19; 19; 38 where b = 19 is the base of the series. Only for the penultimate position, value 22 was selected instead of value 19 for d9 and d10 to build in a certain asymmetry. The values of series u1, u2, u5, u7, ... are approximately constant and equal to 9. Value u1 can be selected so that the following condition applies:

$2 \cdot u1 < b$

Setting u1 = 9 and b = 19 meets this requirement. Value z1 is derived as is deemed appropriate when a first finger electrode is inserted into the space still available. In contrast to this, the values u3, u4, u6, u8, u10, u12 are characterized by not being constant.

In this case, it should be noted that such structures do not have to be absolutely symmetrical. Moreover, a concentration of the electrodes could also be provided at the edges. FIGS. 4 and 5 show the ground line uninterrupted; however, it could also be divided into pieces and connected in parallel.

Figure 3:
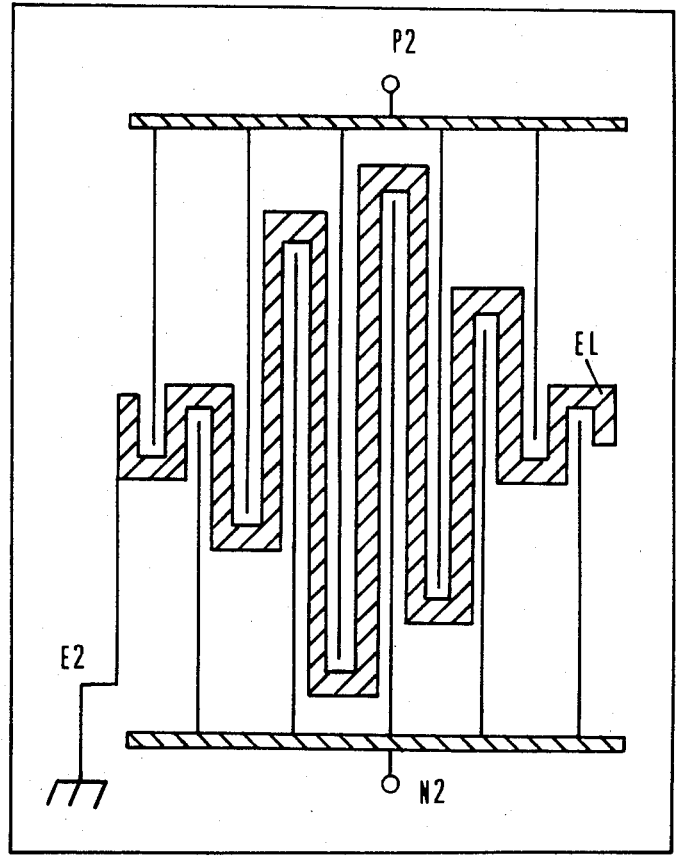
FIG. 3 is a schematic representation of a directional transducer with electrode fingers of different lengths as is known in the art.
Figure 6:
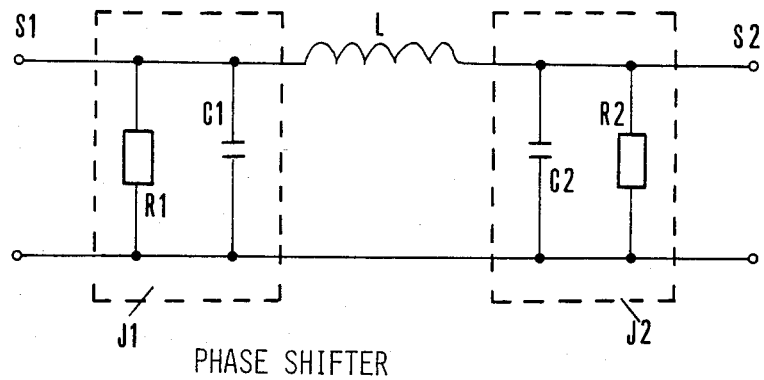
FIG. 6 is a schematic diagram of a phase shifter for a SAW filter according to FIG. 1.

FIG. 6 shows a phase shifter suitable for use with the SAW filter of FIG. 1. This phase shifter consists of a Pi network with a series inductance L and two shunt impedance J1 and J2 each of which consist of an RC network R1, C1 and R2, C2, respectively. Another advantage of the structures as shown in FIGS. 2, 4, and 5 as compared to a structure as shown in FIG. 3 is the RC networks J1 and J2 can be made up entirely or at least in part by the self-capacitance and the inherent resistance of the structure. Thus, the use of only an external inductance L can serve as a phase shifting network. Equivalent advantages are retained if more complex phase shifters are used in place of a simple Pi network.

Finally, it should be noted that the dimensions of the finger electrodes shown are not true to scale in FIGS. 2 to 5. Particularly their length dimensions often should be increased. To simplify the representation in the figures, the ground circuits are indicated only partly by shaded areas. In actual applications, the largest area possible is usually selected for the ground circuits; therefore, most of the substrate area between the electrode fingers is filled by the meandering ground line.

In FIGS. 2, 4 and 5, the SAW filters, and particularly the electrodes, are shown in schematic form. However, the electrodes must have a certain width to stimulate the acoustic waves in such SAW filters. It is practical to choose a electrode width at least approximately equal to a quarter wavelength (L/4) of the surface acoustic waves. The width of the spaces between the electrodes may also be close to L/4. Generally, values Zi and zi in Tables I and II are also proportional to L/4.

With the dimensions given, each electrode plus its adjacent space has a width of approximately L/2. Consequently, in the transducer shown in FIG. 2, for example, the distance q1 q2 between the middle half-group center q2 and one of the two adjacent half-group centers q1 will be greater than the sum of the distance q2 q3 between this middle half-group center q2 and the other adjacent half-group center q3 plus the width (L/2) of at least one electrode with its adjacent space. That is:

$q1q2 \geq q2q3 + L/2$.

This formula follows because the center group GM of electrodes has at least one more electrode than each of the adjacent side groups GL or GR.

To make the transducers of a SAW filter according to FIG. 2 directional, the width of the long section of the meandering ground line is often dimensioned to be alternately equal to L/2 or L.

Minor deviations from the specified electrode widths and positions in the order of a few percentage points can be very effective however in reducing secondary disturbances.

There has thus been shown and described a novel surface acoustic wave filter which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A surface acoustic wave (SAW) filter formed by a piezoelectric substrate having a substrate surface and at least one transducer disposed on said surface; said transducer comprising, in combination a first plurality of spaced, generally parallel, electrically conductive finger electrodes which are connected to a first terminal and carried by said substrate, and a second plurality of spaced, generally parallel, electrically conductive finger electrodes which are connected to a second terminal and carried by said substrate; the finger electrodes of the first plurality being generally arranged in the intermediate spaces between the finger electrodes of the second plurality; a common terminal for each of said first and second plurality of finger electrodes, said common terminal comprising a strip of electrically conductive material spaced from and meandering through the spaces between said first and second plurality of finger electrodes; said first plurality having several finger electrodes arranged at distances from each other that have values B1, B2, B3, . . . , for which the following condition applies:

$$B1 \leqq B2 \leqq B3 \leqq \ldots$$

where the equal sign is omitted at least once.

2. The SAW filter according to claim 1, wherein said piezoelectric transducer is a send transducer for converting electrical energy into acoustic wave energy.

3. The SAW filter according to claim 1, wherein said piezoelectric transducer is a receive transducer for converting acoustic wave energy into electrical energy.

4. The SAW filter according to claim 1, wherein there are at least two of said piezoelectric transducers, one of said transducers being a send transducer for converting electrical energy into acoustic wave energy and the other of said transducers being a receive transducer for converting acoustic wave energy into electrical energy.

5. The SAW filter according to any one of claims 1-4, wherein the values of the distances B1, B2, B3, . . . form at least approximately a series having the following form:

$$B, B, \ldots B, 2 \cdot B, 2 \cdot B, \ldots 2 \cdot B, 3 \cdot B, 3 \cdot B, \ldots$$

where B is a constant, and wherein a deviation of 0% up to +25% is provided for at least one of the distance values B, 2·B, 3·B, . . . .

6. The SAW filter according to any one of claims 1-4, wherein there are several finger electrodes for which the distance between a finger electrode of the first plurality and the nearest finger electrode of the second plurality is at least approximately the same.

7. The SAW filter according to any one of claims 1-4, further comprising a phase shifter connected to one of said terminals for shifting the phase of the transmitted signal, and wherein the self-capacitance and the inherent resistance of the transducer structure form the RC networks of said phase shifter.

* * * * *